United States Patent
Chandrasekar et al.

(10) Patent No.: US 11,227,834 B2
(45) Date of Patent: Jan. 18, 2022

(54) PACKAGE GROUNDING SYSTEM

(71) Applicant: Seagate Technology LLC, Cupertino, CA (US)

(72) Inventors: Karthik Chandrasekar, Cupertino, CA (US); Ratnakar Dadi, Cupertino, CA (US); Shawn Tzung-Sheng Lo, San Jose, CA (US); Emmanuel Atta, Cupertino, CA (US); Alexander Tain, Milpitas, CA (US); Subodh Yashwant Bhike, Cupertino, CA (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

(21) Appl. No.: 16/776,255

(22) Filed: Jan. 29, 2020

(65) Prior Publication Data

US 2021/0233845 A1  Jul. 29, 2021

(51) Int. Cl.
- H01L 23/528 (2006.01)
- G11B 33/12 (2006.01)
- H01L 23/552 (2006.01)
- G11B 33/14 (2006.01)
- H01L 23/498 (2006.01)

(52) U.S. Cl.
CPC ........ H01L 23/5286 (2013.01); G11B 33/126 (2013.01); G11B 33/1493 (2013.01); H01L 23/498 (2013.01); H01L 23/5283 (2013.01); H01L 23/552 (2013.01)

(58) Field of Classification Search
CPC ............... H01L 23/5286; H01L 23/498; H01L 23/5283; H01L 23/552; G11B 33/126; G11B 33/1493
See application file for complete search history.

(56) References Cited

U.S. PATENT DOCUMENTS

| 6,808,399 B2 | 10/2004 | Rothermel et al. |
| 8,669,646 B2 | 3/2014 | Tabatabai et al. |
| 2007/0289771 A1* | 12/2007 | Osaka ................. H05K 1/0236 174/250 |

(Continued)

FOREIGN PATENT DOCUMENTS

| JP | 2014-7518 A | 1/2014 |
| JP | 2016-192761 A | 11/2016 |
| WO | 01/52344 A1 | 7/2001 |

OTHER PUBLICATIONS

Jeong, Youchul et al., "Hybrid Analytical Modeling Method for Split Power Bus in Multilayered Package", IEEE Transactions on Electromagnetic Compatiblity, vol. 48, No. 1, Feb. 2006, 0018-9375/$20.00 © 2006 IEEE, 14 pages.

(Continued)

*Primary Examiner* — Peniel M Gumedzoe
(74) *Attorney, Agent, or Firm* — Westman, Champlin & Koehler, P.A.

(57) ABSTRACT

A system including an analog block and a digital block. The analog block and the digital block are arranged on a package. The package includes a first ground coupled to the analog block and a second ground coupled to the digital block. The second ground is physically separate from the first ground. The package also includes a noise-mitigation stitching connector that has a first end connected to the first ground and a second end connected to the second ground.

20 Claims, 6 Drawing Sheets

(56) References Cited

U.S. PATENT DOCUMENTS

| | | | | |
|---|---|---|---|---|
| 2008/0211068 A1* | 9/2008 | Chen | ............... | H01L 23/3107 |
| | | | | 257/666 |
| 2009/0080135 A1* | 3/2009 | Major | ............... | H01L 23/60 |
| | | | | 361/220 |
| 2009/0262475 A1* | 10/2009 | Darabi | ............... | H01L 23/60 |
| | | | | 361/56 |
| 2010/0258905 A1* | 10/2010 | Song | ............... | H01L 25/0655 |
| | | | | 257/532 |
| 2011/0222247 A1* | 9/2011 | Motohashi | ........... | H05K 1/0227 |
| | | | | 361/748 |

OTHER PUBLICATIONS

Bryant, James et al., "Chapter 9, Hardware Design Techniques", Hardware Design Techniques 9.1 Passive Components, 216 pages.
Knack, Lee RitcheyKella, "Properly ground your circuits", EDN Network, Jan. 6, 2017, 6 pages.
Zumbahlen, Hank, "Staying Well Grounded", Analog Dialogue 46-06, Jun. 2012, www.analog.com/analogdialogue, 9 pages.

\* cited by examiner

PACKAGE GROUNDING SYSTEM

SUMMARY

In one embodiment, a system comprises an analog block and a digital block. The analog block and the digital block are arranged on a package. The package comprises a first ground coupled to the analog block and a second ground coupled to the digital block. The second ground is physically separate from the first ground. The package also includes a noise-mitigation stitching connector that has a first end connected to the first ground and a second end connected to the second ground.

In another embodiment, a data storage device comprises a printed circuit board assembly. The printed circuit board assembly comprises a storage device analog block and a storage device digital block. The storage device analog block and the storage device digital block are arranged on a package. The package comprises a first ground coupled to the storage device analog block and a second ground coupled to the storage device digital block. The second ground is physically separate from the first ground. The package also includes a noise-mitigation stitching connector that has a first end connected to the first ground and a second end connected to the second ground.

In yet another embodiment, a method is provided. The method includes arranging an analog block and digital block on a package. The method also includes coupling the analog block to a first ground on the package, and coupling the digital block to a second ground on the package, the second ground being physically separate from the first ground. The method further includes connecting a first end of a noise-mitigation stitching connector to the first ground and connecting a second end of the noise mitigation stitching connector to the second ground.

This summary is not intended to describe each disclosed embodiment or every implementation of elements of the package grounding system. Many other novel advantages, features, and relationships will become apparent as this description proceeds. The figures and the description that follow more particularly exemplify illustrative embodiments.

DETAILED DESCRIPTION

The present disclosure provides a package ground isolation technique which mitigates analog to digital noise coupling on a die.

Currently, noise coupling between analog and digital blocks on a package or die with a shared ground is mitigated by splitting ground planes on the package or die, or by including additional layers above the package core. However, such noise mitigation measures may result in signal integrity (SI) weakness, high inductance, etc.

Splitting the ground plane on the package may lead to SI weakness with a circuit return path, or a high inductance. Moving the grounds farther away from the die and closer to the printed circuit board (PCB) layers may decrease the robustness of the ground plane connection and increase the return path inductance.

Embodiments of this disclosure provide mitigation of noise coupling between an analog and a digital block by providing the analog block with a first ground and the digital block with a second ground, which is physically separated from the first ground. The first ground is electrically coupled to the second ground by a noise-mitigation stitching connector. This solution does not utilize explicit package layer isolation globally, and employs local isolation, which helps in preserving SI return path performance for input/output (I/O) interfaces and sensitive clock routes. Prior to providing additional details regarding the different embodiments, a description of an illustrative operating environment is provided below.

Figure 1:
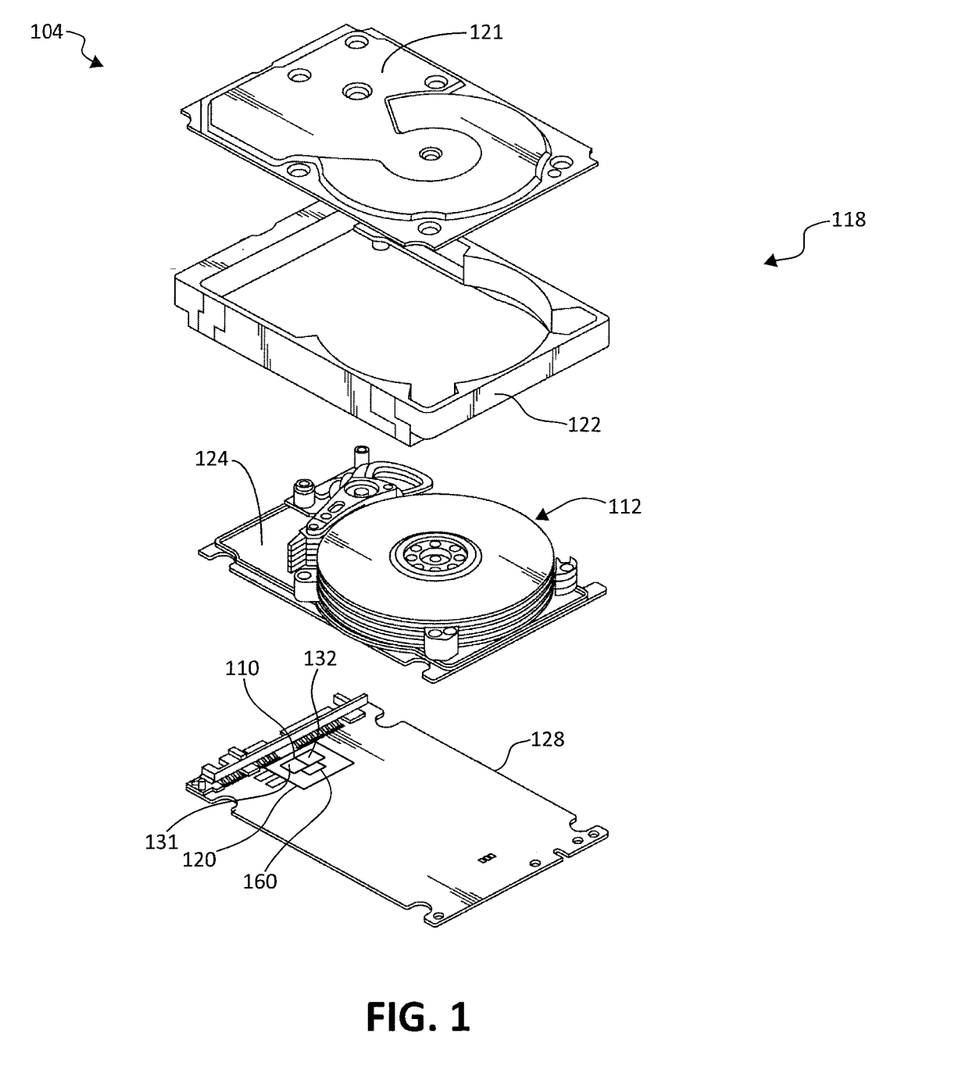
FIG. 1 illustrates an example of a data storage device in which embodiments of the present application can be used.

FIG. 1 shows an illustrative operating environment in which certain embodiments disclosed herein may be incorporated. The operating environment shown in FIG. 1 is for illustration purposes only. Embodiments of the present disclosure are not limited to any particular operating environment such as the operating environment shown in FIG. 1. Embodiments of the present disclosure are illustratively practiced within any number of different types of operating environments.

It should be noted that the same reference numerals are used in different figures for same or similar elements. It should also be understood that the terminology used herein is for the purpose of describing embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," "intermediate" and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

It will be understood that when an element is referred to as being "connected," "coupled," or "attached" to another element, it can be directly connected, coupled or attached to the other element, or it can be indirectly connected, coupled, or attached to the other element where intervening or intermediate elements may be present. In contrast, if an element is referred to as being "directly connected," "directly coupled" or "directly attached" to another element, there are no intervening elements present. Drawings illustrating direct connections, couplings or attachments between elements also include embodiments, in which the elements are indirectly connected, coupled or attached to each other.

FIG. 1 illustrates provides an exploded view of a Hard Disk Drive (HDD) 104 in which embodiments of the disclosure are useful. As can be seen in FIG. 1, HDD 104 includes a housing 118 having a top cover 121, a base-deck frame 122 and a base-deck floor 124. In the embodiment shown in FIG. 1, base-deck frame 122 and base-deck floor 124 are two separate pieces. However, in other embodiments, base-deck frame 122 and base-deck floor 124 may be a single piece. The housing 118, including the base-deck frame 122, base-deck floor 124 and the top cover 121, may adhere to any of a number of different form factors, including, for example, the 2.5" and 3.5" form factors for HDDs. Data storage disks 112 are the primary data storage media in HDD 104. HDD 104 further includes a PCB 128 assembly that includes analog-to-digital converter (ADC) die 110 mounted on a package 120. ADC die 110 may be a configured as a flip chip (FC). Die 110 may comprise an analog block 131 and a digital block 132 mounted on package 120. Package 120 may include a plurality of grounds (not shown) connected by a noise-mitigation stitching connector 160. Noise mitigation connection configurations are described in detail further below. Analog block 131 and digital block 132 may include circuitry that helps perform operations related to reading data from and writing data to data storage disks 112. Details regarding HDD components employed to carry out read and write operations are provided below in connection with FIG. 2.

Figure 2:
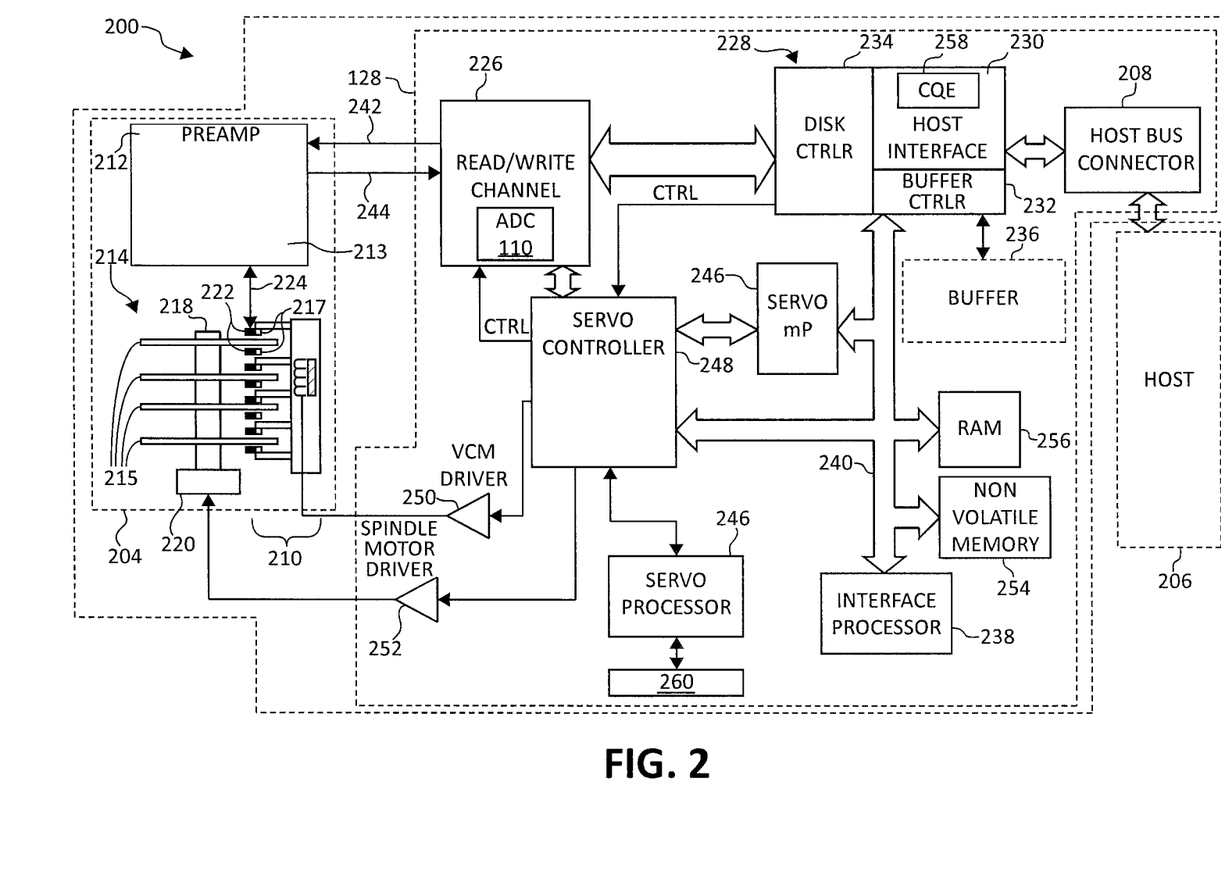
FIG. 2 is a block diagram of a disk drive in accordance with one embodiment.

FIG. 2 illustrates a disk storage system 200 as found in the HDD 104 of FIG. 1. Disk storage system 200 includes PCB 128 and a head-disk assembly (HDA) 204. PCB 128 includes circuitry and processors, which provide a target interface controller (or drive controller) for communicating between a host system 206 and HDA 204. Host system 206 can include a microprocessor-based data processing system such as a personal computer or other system capable of performing a sequence of logical operations. Data is transmitted between host system 206 and PCB 128 via a host bus connector 208. HDA 204 includes an actuator assembly 210, a preamplifier 212, and a disk assembly 214. Disk assembly 214 includes one or more media disks 215, stacked on a spindle assembly 218. Spindle assembly 218 is mechanically coupled to a spindle motor 220 for rotating the disk(s) at a high rate of speed.

Actuator assembly 210 includes a voice coil motor and multiple actuator arms. Located at the end of each actuator arm are one or more sliders/transducer heads such as 222, which are associated with a respective disk surface. Transducer heads 222 communicate with PCB 128 via cable assembly 224 connected to preamplifier 212 for reading and writing data to the transducer head's associated disk surface. Preamplifier 212 provides an amplified signal to a read/write channel 226 of PCB 128. Read/write channel 226 performs encoding and decoding of data written to and read from the disk.

Data storage control circuitry such as a servo processor 246 provides intelligent control of actuator assembly 210 and spindle motor 220 through a servo controller 248. By commands issued to servo controller 248 by servo processor 246, voice coil motor (VCM) driver 250 is coupled to move actuator assembly 210, and spindle motor driver 252 is coupled to maintain a constant spin rate of spindle motor 220.

PCB 128 includes a host interface disk controller (HIDC) application-specific integrated circuit (ASIC) 228. ASIC 228 includes a host interface 230, a buffer controller 232, and a disk controller 234. Host interface 230 communicates with host system 206 via host bus connector 208 by receiving commands and data from and transmitting status and data back to host system 206. A command queuing engine (CQE) 258 is incorporated in host interface 230.

Buffer controller 232 controls a non-volatile buffer memory 236. Disk controller 234 tracks the timing of data sectors passing under a currently selected transducer head and accordingly sends data to and receives data from read/write channel 226. Disk controller 234 also provides for error correction and error detection on data transmitted to and read from disk assembly 214.

An interface processor 238 manages a queue of commands received from host system 206 with the assistance of the CQE 258 embedded in host interface 230. Interface processor 238 interfaces with functional elements of PCB 128 over a bus 240, for transfer of commands, data, and status.

Disk system operational programs may be stored in non-volatile program storage memory 254, such as read-only memory (ROM) or flash memory, and are loaded into random access memory (RAM) or program loading memory 256 for execution by interface processor 238. Suitably, servo processor 246 may have integrated or separate memory 260 for storage of servo programs.

As mentioned above, preamplifier 212 provides an amplified signal to a read/write channel 226 of PCB 128. Read/write channel 226 includes ADC die 110.

Analog block 131 as mentioned in FIG. 1 may include read/write channel 226 and ADC die 110 for converting the analog signal to a digital for digital block 132, which may be configured as servo controller 248.

In situations where analog block 131 has a high resistance metallization or is more sensitive in terms of having higher jitter sensitivity, noise can dominate the analog block, necessitating mitigation of the noise.

As mentioned above, noise coupling between analog and digital blocks on a package or die has previously been mitigated by splitting ground planes on the package or die, or by including additional layers above the package core. However, these solutions may result in SI weakness or high inductance or increase cost due to the need for additional layers on package 120. Further, the mentioned solutions may add thermal challenges, for example, additional package layers for HDD may make it harder to conform to height/thermal constraints of HDD.

Figure 3A:
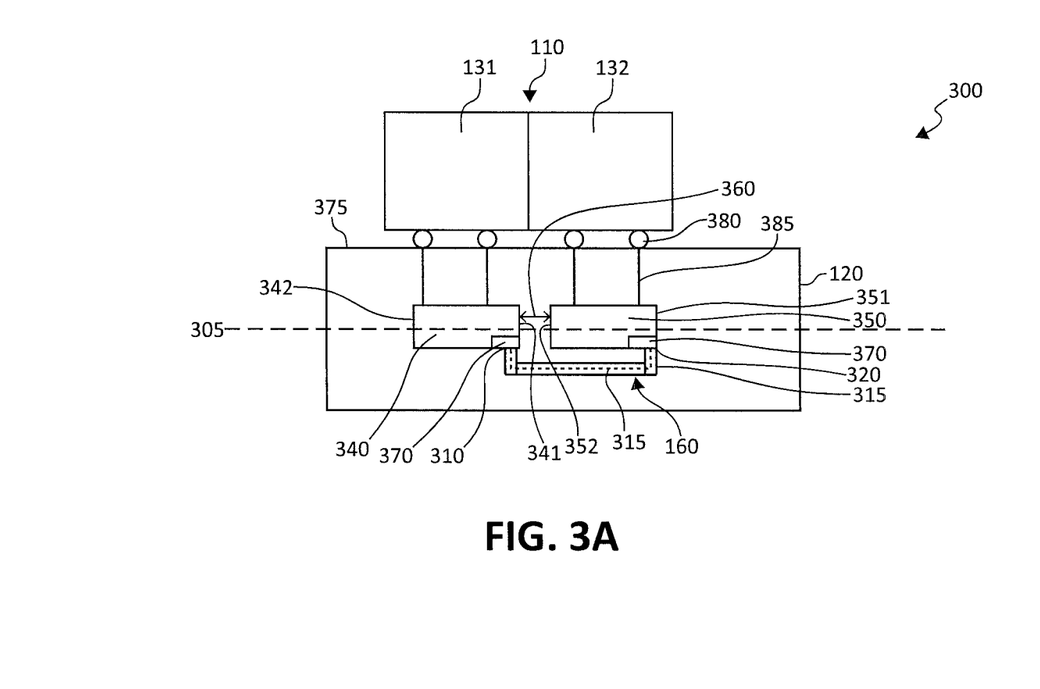
FIG. 3A is a cross-sectional view of an embodiment of a package grounding system in accordance with one embodiment.

To address these problems, an embodiment of this disclosure is illustrated in FIG. 3A showing a cross-sectional view of a grounding system 300 for ADC die 110 shown in FIGS. 1 and 2. Analog block 131 and digital block 132 in ADC die 110 may be arranged on package 120. Package 120 may have a first ground 340 coupled to analog block 131 and a second ground 350 coupled to digital block 132. Second ground 350 is physically separate from first ground 340. First ground 340 and second ground 350 may be configured as a plane or a strip. Noise-mitigation stitching connector 160 has a first end 310 connected to first ground 340 and a second end 320 connected to second ground 350. Noise-mitigation stitching connector 160 connects first ground 340 and second ground 350 such that noise in package 120 is reduced, noise-mitigation stitching connector 160 itself being the mechanism to reduce noise.

First ground 340 includes a first proximate end 341 and a first distal end 342. Second ground 350 includes a second distal end 351 and a second proximate end 352. First ground 340 and second ground 350 may be arranged along an axis 305 of package 120. First ground 340 and second ground 350 may be physically separated by a first separation distance 360 where the first separation distance 360 is the distance between first proximate end 341 of first ground 340 and second proximate end 352 of second ground 350.

In the embodiment illustrated in FIG. 3A, a connection point 370 for noise-mitigation stitching connector 160 is arranged at first proximate end 341 of first ground 340 and a connection point 370 is arranged at second distal end 351 of second ground 350. However, it should be noted that the connections are not limited to this arrangement. In fact, noise-mitigation stitching connector 160 may be connected to first ground 340 and second ground 350 at any point, as long as a length 315 of noise-mitigating stitching connector 160 is greater than first separation distance 360 between first proximate end 341 and second proximate end 352. Length 315 is the length of the noise-mitigating stitching connector 160 between the connection points to first ground 340 and second ground 350.

For grounding system 300 where first ground 340 and second ground 350 are embedded within package 120, ADC die 110 may comprise connectors 380 connected to lines 385 which connect analog block 131 to first ground 340 and digital block 132 to second ground 350.

Figure 3B:
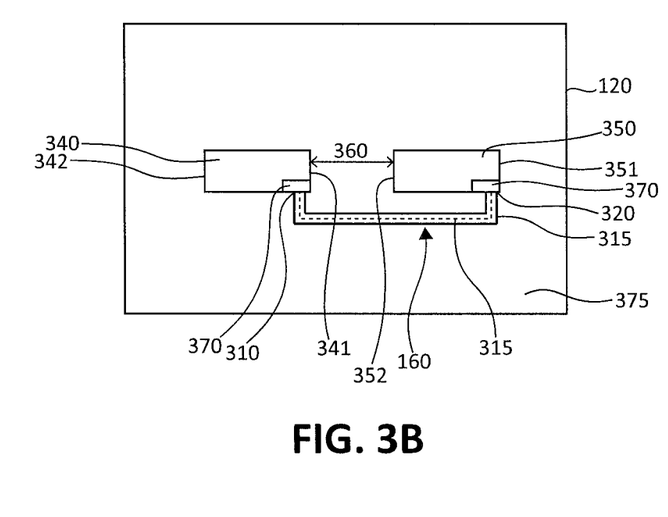
FIG. 3B is a perspective view of a package grounding system in accordance with yet another embodiment.

FIG. 3B illustrates a top view of an embodiment of package 120 of grounding system 300. In the illustrated arrangement, first ground 340, second ground 350 and noise-mitigation stitching connector 160 may be arranged on a top surface 375 of package 120. Connectors 380 of ADC die 110 may have a direct physical connection (shown in FIG. 4B) to first ground 340 and second ground 350 rather than having lines 385 through a material of package 120.

Figure 4A:
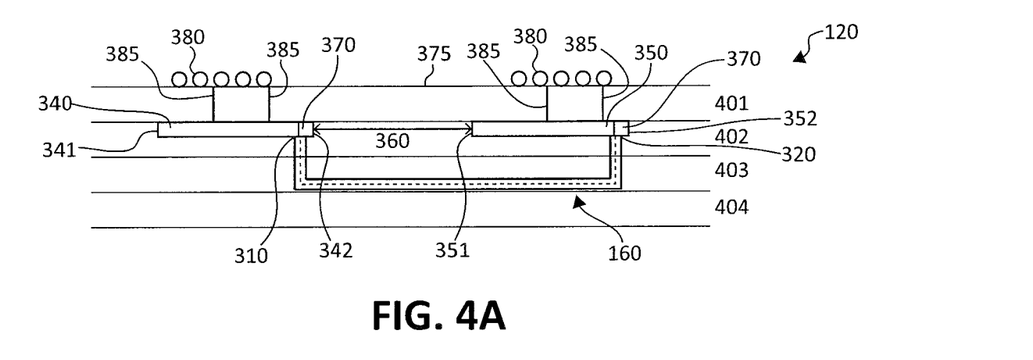
FIG. 4A is a cross-sectional view of a package in accordance with the embodiment of FIG. 3A.

FIG. 4A illustrates a cross-sectional view of an embodiment of package 120 corresponding to FIG. 3A having a plurality of layers 401, 402, 403, 404. Package 120 may include more or fewer layers. In certain embodiments, layers 401, 402, 403, 404 may be copper layers. As illustrated, first ground 340 and second ground are arranged in a second layer 402. Noise-mitigating stitching connector 160 may be arranged through multiple layers. As a non-limiting example, FIG. 4A illustrates noise-mitigating stitching connector 160 being arranged through second layer 402 and third layer 403.

Figure 4B:
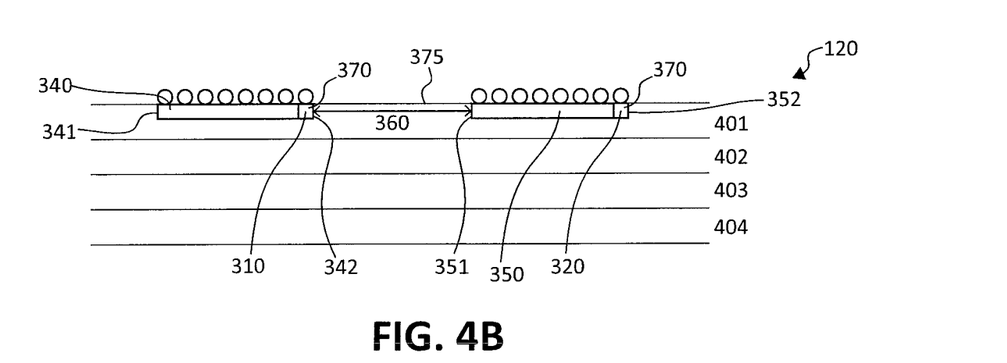
FIG. 4B is a cross-sectional view of a package in accordance with the embodiment of FIG. 3B.

FIG. 4B illustrates a cross-sectional view of an embodiment of package 120 corresponding to FIG. 3B. First ground 340 and second ground 350 may be arranged at top surface 375 of first layer 401. First end 310 of noise-mitigating stitching connector 160 may be connected to first ground 340 at first proximate end 341 and second end 320 may be connected to second distal end 35 land arranged on top surface 375 of first layer 401. It should be noted that in the embodiment illustrated in FIG. 4B is a cross-sectional view of package 120 shown in top view format in FIG. 3B. Because noise-mitigating stitching connector 160 is planar with top surface 375 of first layer 401, noise-mitigating stitching connector 160 is not explicitly shown, rather, the dot on connection point 370 arranged on first ground 340 indicates first end 310 coming out of the page on first ground 340 and the dot on connection point 370 arranged on second ground 350 indicates second end 320 of noise-mitigating stitching connector 160 coming out of the page. This is to indicate that the noise-mitigating stitching connector 160, first ground 340 and second ground 350 are arranged on the same plane 401.

Figure 5:
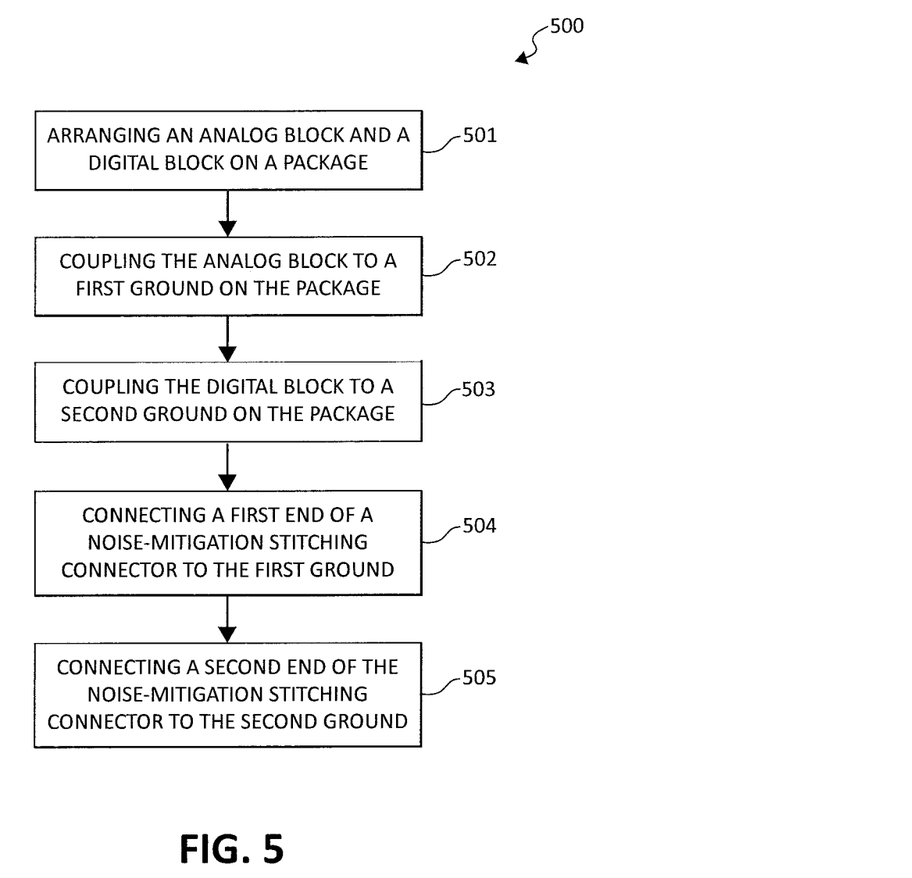
FIG. 5 is a block diagram of a method in accordance with one embodiment.

FIG. 5 illustrates a method 500 according to the above mentioned embodiments. The method 500 includes arranging an analog block and a digital block on the package in block 501. Coupling the analog block to the first ground on the package is shown in block 502. Coupling the digital block to the second ground on the package, the second ground being physically separate from the first ground is shown in block 503. Connecting the first end of the noise-mitigation stitching connector to the first ground is shown in block 504. Connecting the second end of the noise-mitigation stitching connector to the second ground is shown in block 505.

In a simulation for a traditional ground design, where the analog and digital blocks share a ground, the transfer impedance was found to be 116 milliohms (mohms). However, using an embodiment of the present disclosure, the transfer impedance was 82 mohms. The lower transfer impedance implies a lower noise coupling.

In further simulations, a shared ground package showed a relatively high clock peak-to-peak jitter (e.g., a relatively high deviation of a clock pulse edge location from an ideal clock pulse edge location) of 149 picoseconds (ps). In contrast, a simulation of an embodiment described above showed a peak-to-peak jitter of 55 ps. This indicates that transient noise in the present embodiments produces an active clock jitter that is less than that produced by the traditional shared ground package.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and therefore are not drawn to scale. Certain proportions within the illustrations may be exaggerated, while other proportions may be reduced. Accordingly, the disclosure and the figures are to be regarded as illustrative rather than restrictive.

Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments employ more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

What is claimed is:

1. A system comprising:
    an analog block;
    a digital block;
    a package on which the analog block and the digital block are arranged, the package comprising:
        a first ground coupled to the analog block;
        a second ground coupled to the digital block and that is physically separate from the first ground, thereby providing a space between the first ground and second around; and
        a noise-mitigation stitching connector having a first end connected to the first ground and a second end connected to the second ground, such that the noise-mitigation stitching connector is positioned outside the space between the first ground and the second ground.

2. The system of claim 1, wherein the first and the second grounds are arranged in different planes.

3. The system of claim 1, wherein the first ground has a first proximate end and a first distal end, and the second ground has a second proximate end and a second distal end, the first ground and the second ground are arranged along a same axis with a first separation distance between the first proximate end and the second proximate end.

4. The system of claim 3, wherein the noise-mitigation stitching connector has a length that is greater than the first separation distance.

5. The system of claim 3, wherein the first end is connected to the first ground between the first proximate end and the first distal end.

6. The system of claim 3, wherein the first end of the noise-mitigation stitching connector is connected to the first distal end.

7. The system of claim 3, wherein the second end of the noise-mitigation stitching connector is connected between the second proximate end and the second distal end.

8. The system of claim 3, wherein the second end of the noise-mitigation stitching connector is connected to the second distal end.

9. The system of claim 1, wherein the noise-mitigation stitching connector is planar with a top surface of the package.

10. The system of claim 1, wherein the package comprises a plurality of layers.

11. The system of claim 10, wherein the noise-mitigation stitching connector is arranged in the plurality of layers.

12. A data storage device comprising:
    a printed circuit board assembly comprising:
        a storage device analog Nock;
        a storage device digital block;
        a package on which the storage device analog Nock and the storage device digital block are arranged, the package comprising:
            a first ground coupled to the storage device analog block;
            a second ground coupled to the storage device digital block, the second ground being physically separate from the first ground, and thereby providing, a space between the first ground and second ground; and
            a noise-mitigation stitching connector having a first end connected to the first ground and a second end connected to the second ground, such that the noise-mitigation stitching connector is positioned outside the space between the first ground and the second ground.

13. The data storage device of claim 12, wherein the first ground has a first proximate end and a first distal end, and the second ground has a second proximate end and a second distal end, the first and second grounds are arranged along a same axis with a first separation distance between the first proximate end and the second proximate end.

14. The data storage device of claim 13, wherein the noise-mitigation stitching connector has a length that is greater than the first, separation distance.

15. The data storage device of claim 12, wherein the storage device analog block comprises read/write channel circuitry and wherein the storage device digital block comprises data storage control circuitry.

16. A method comprising:
    arranging an analog block and a digital block on a package;
    coupling the analog block to a first ground on the package;
    coupling the digital block to a second ground on the package, the second ground being physically separate from the first ground, and thereby providing a space between the first ground and second ground;
    connecting a first end of a noise-mitigation stitching connector to the first ground, and connecting a second end of the noise-mitigation stitching connector to the second ground, such that the noise-mitigation stitching connector is positioned outside the space between the first ground and the second ground.

17. The method of claim 16, wherein the first ground has a first proximate end and a first distal end, and the second ground has a second proximate end and a second distal end, the method further comprising arranging the first and second grounds along a same axis with a first separation distance between the first proximate end and the second proximate end.

18. The method of claim 17, further comprising connecting the first end of the noise-mitigation stitching connector to the first distal end.

19. The method of claim 17, further comprising connecting the first end of the noise-mitigation stitching connector between the first proximate end and the first distal end.

20. The method of claim 17, further comprising connecting the second end of the noise-mitigation stitching connector between the second proximate end and the second distal end.

* * * * *

UNITED STATES PATENT AND TRADEMARK OFFICE
CERTIFICATE OF CORRECTION

PATENT NO. : 11,227,834 B2  
APPLICATION NO. : 16/776255  
DATED : January 18, 2022  
INVENTOR(S) : Karthik Chandrasekar et al.

Page 1 of 1

It is certified that error appears in the above-identified patent and that said Letters Patent is hereby corrected as shown below:

In the Claims

Column 7, Claim 1, Line 15 replace the word "around" with the word --ground--.

Column 7, Claim 12, Line 54 replace the word "Nock" with the word --block--.

Column 7, Claim 12, Line 56 replace the word "Nock" with the word --block--.

Signed and Sealed this  
First Day of March, 2022

Drew Hirshfeld  
*Performing the Functions and Duties of the  
Under Secretary of Commerce for Intellectual Property and  
Director of the United States Patent and Trademark Office*